United States Patent [11] 3,623,961

[72] Inventor Karel Jakobus Blok van Laer
Mollenhutseweg, Nijmegen, Netherlands
[21] Appl. No. 697,410
[22] Filed Jan. 12, 1968
[45] Patented Nov. 30, 1971
[73] Assignee U.S. Philips Corporation
New York, N.Y.

[54] METHOD OF PROVIDING AN ELECTRIC CONNECTION TO A SURFACE OF AN ELECTRONIC DEVICE AND DEVICE OBTAINED BY SAID METHOD
4 Claims, 9 Drawing Figs.

[52] U.S. Cl. .......... 204/15, 29/576, 156/8, 317/234 R
[51] Int. Cl. .......... C23b 5/48, B01j 17/00, H01l 3/00
[50] Field of Search .......... 204/15; 29/197, 576; 117/212; 317/234 (5.3)

[56] References Cited

UNITED STATES PATENTS

| | | | |
|---|---|---|---|
| 3,386,894 | 6/1968 | Steppat | 204/15 |
| 3,408,271 | 10/1968 | Reissmueller et al. | 204/15 |
| 3,462,349 | 8/1969 | Gorgenyi | 204/15 |
| 3,345,210 | 10/1967 | Wilson | 117/212 |
| 3,412,456 | 11/1968 | Ebisawa | 117/212 |
| 3,437,888 | 4/1969 | Hall | 317/234 |
| 3,419,765 | 12/1968 | Clark et al. | 317/234 |
| 3,430,104 | 2/1969 | Burgess et al. | 317/234 |
| 3,438,120 | 4/1969 | Amsterdam et al. | 317/234 |

*Primary Examiner*—J. H. Mack
*Assistant Examiner*—T. Tufariello
*Attorney*—Frank R. Trifari

ABSTRACT: A method of making copper bump contacts on a monolithic integrated circuit is described. The semiconductor is first contacted by aluminum through a hole in a covering oxide. Next, finally divided nickel is vapor-deposited onto the aluminum. Preferably, before provision of the nickel layer, the aluminum is alloyed to the semiconductor and recoated with fresh aluminum. Finally, copper is electroplated onto the nickel to form the bump. A feature is the use of the nickel as an etch-resistant mask for selective removal of the underlying aluminum.

Figure 1:
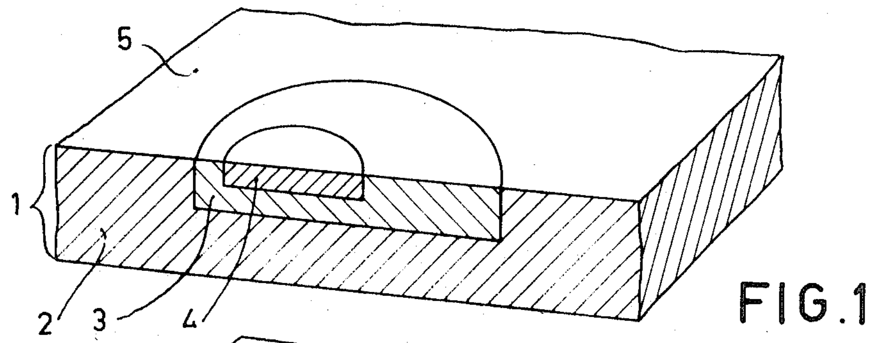

INVENTOR.
KAREL J. BLOK VAN LAER
BY
*[signature]*
AGENT

INVENTOR.
KAREL J. BLOK VAN LAER

BY

Frank R. Trifari
AGENT

INVENTOR.
KAREL J.BLOK VAN LAER
BY
Frank R. Trifari
AGENT

METHOD OF PROVIDING AN ELECTRIC CONNECTION TO A SURFACE OF AN ELECTRONIC DEVICE AND DEVICE OBTAINED BY SAID METHOD

The invention relates to a method of providing an electric connection on a surface of an electronic device, in particular an integrated semiconductor crystal circuit, the surface of which may at least partly be formed by an insulating layer, for example, consisting of silicon dioxide or of a glass consisting of silicon dioxide and boron oxide ($B_2O_3$), a metal layer, hereinafter referred to as the contact layer, being provided on said surface which is fortified by electrodeposition as a result of which said connection is obtained. In such a method it is known to produce the contact layer from silver or chromium and to form a connection on the said layer by electrodeposition of a layer of silver. It has also been proposed already to form a contact layer by first depositing chromium from the vapor phase, then aluminum, and subsequently silver in such manner that the deposition processes overlap each other partly and mixed transition regions between layers consisting of pure metal being thus formed.

However, the electronic devices manufactured in this manner may show electric instabilities which may be ascribed to migration of the silver over the surface. Alternatively it is known that silver can easily be removed from an oxide layer on which it is vapor-deposited. This is of advantage when the silver layer is only temporary and must be removed again, but this property may also give rise to a less satisfactory mechanical connection between the electric connections and the underlying part of the electronic device.

The invention on the contrary relates more in particular to the formation of a connection on a contact layer in which aluminum is in direct contact with the surface of the electronic device. The use of aluminum for this purpose is normal practice and was described, for example, in U.S. Pat. No. 2,984,775. Aluminum, for example, is very suitable for the formation of ohmic contacts both on silicon of the P-type and on silicon of the N-type. It is difficult, however, to form a connection by electrodeposition on a contact layer of aluminum which connection is mechanically rigidly secured to said layer, while the use of successive and overlapping vapor deposition processes of aluminum and other elements is difficult and not always possible, particularly not when a contact layer consisting exclusively of aluminum is to be subjected to a certain thermal treatment before a connection is provided.

It is one of the objects of the invention to avoid the above-mentioned drawbacks.

According to the invention, the contact layer consists of aluminum on which a layer of elementary nickel in a finely divided form is deposited after which the connection is formed on the nickel by electrodeposition. This nickel layer is hereinafter referred to as the intermediate layer.

The deposition of elementary nickel in a finely divided form is to be understood to mean herein the deposition of nickel in atomic or molecular form or in the form of particles whether ionized or not, by vapor deposition, atomizing or decomposition in the gas phase, in vacuo or in a neutral atmosphere, so by dry chemical methods.

A further advantage of the combination of a contact layer of aluminum and an intermediate layer of nickel is that selective etching agents can be used which leave the nickel unattacked and remove the aluminum or remove the nickel and leave the aluminum intact or remove both (without noticeably attacking $SiO_2$ or Si).

Although the resulting layer enables a fortification with many other metals by electrodeposition which in itself is known in the technology of electrodeposition, according to a preferred embodiment of the invention said fortification is carried out by means of copper.

The invention further relates to an electronic device, in particular an integrated semiconductor crystal circuit, on the surface of which a contact layer is provided with electric connections, which is characterized in that the contact layer consists of aluminum and is covered with nickel at least below the electric connections.

The connections themselves preferably consist of copper.

In order that the invention may be readily carried into effect, one example thereof will now be described in greater detail, with reference to the FIGS.

The FIGS. show, partly in a perspective view and partly in a cross-sectional view, an electronic device in various stages of manufacture. For clearness' sake the figures are shown diagrammatically and on an enlarged scale, the dimensions of the components being varied strongly mutually.

As a simple example of an electronic device is chosen the transistor shown in FIG. 1 which consists of a monocrystalline silicon body 1 having a collector region 2 of the N-type, a base region 3 of the P-type and an emitter region 4 of the N-type. Usually, however, the invention can be applied to more complicated electronic devices, for example, integrated semiconductor crystal circuits, without departing from the principle.

Figure 2:
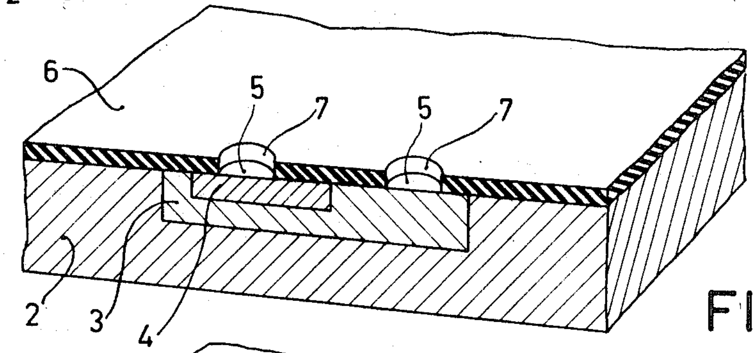

An insulating layer 6 which consists for example, of silicon dioxide and in which two windows 7 are produced, for example, by etching (see FIG. 2) is provided in known manner on the surface 5 of the said body.

Figure 3:
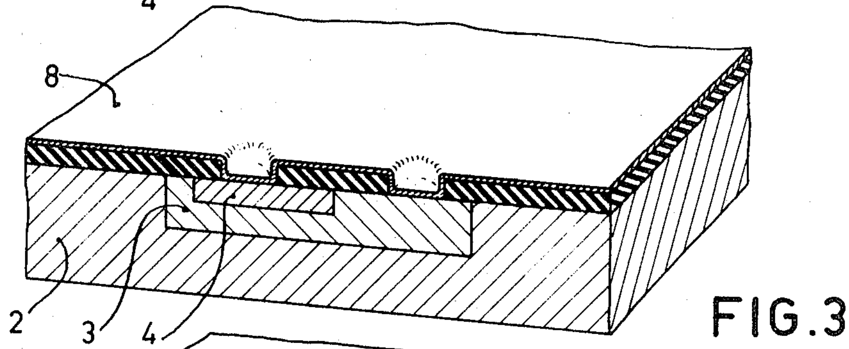

A layer of aluminum 8 is then vapor-deposited in a vacuum of approximately $5\times10^{-6}$ Torr to a thickness of approximately 2,000 A. (see FIG. 3).

On this layer a photosensitive masking layer (not shown) is provided which is again removed entirely with the exception of the regions above the windows 7 and above the edges thereof. This is done photographically in normal manner. The greater part of the aluminum layer 8 is then removed again by etching in a 1 percent solution of sodium hydroxide in water for approximately 1 minute so that two partial layers of aluminum 9 and 10 remain only in the windows 7 and over the edges thereof (FIG. 4).

Figure 4:
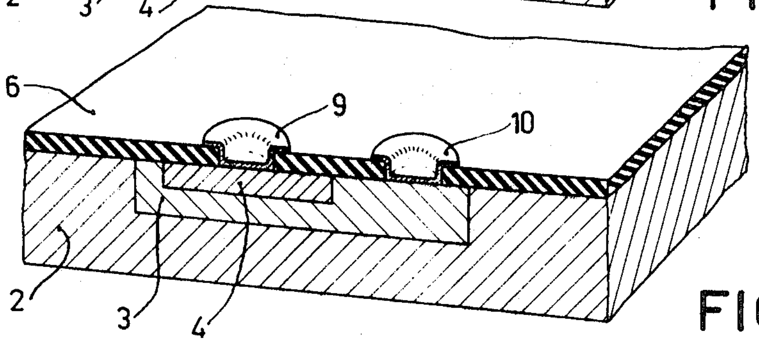

After removing the photosensitive masking layer, the assembly is heated to 550° C. in a neutral atmosphere for example, in argon, as a result of which the layers 9 and 10 form an alloy with the underlying silicon and constitute an ohmic contact therewith, both with the region 3 which is of the P-conductivity type and the region 4 of the N-type (see FIG. 4).

Figure 5:
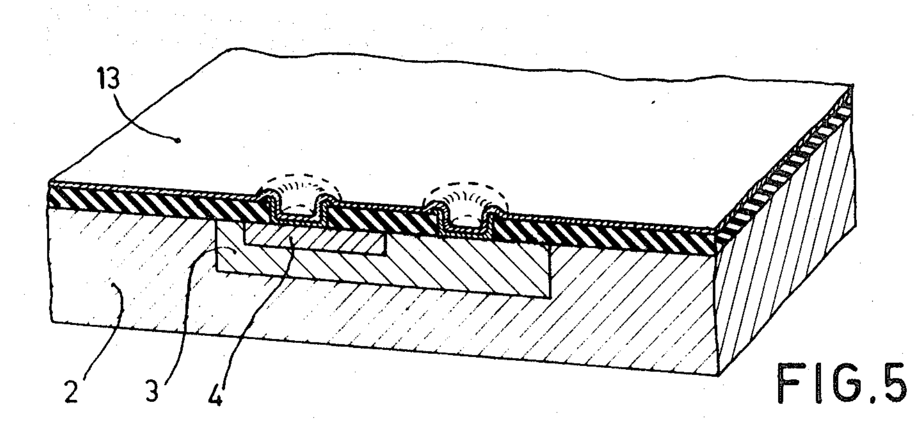

The whole surface is then again coated by vapor deposition with a layer of pure aluminum 13, thickness approximately 10,000 A. (= 1 micron). This layer 13 and the partial layers 9 and 10 together constitute the contact layer (see FIG. 5). The contact layer is now ready for nickel deposition. As the layer 13 has not been heat-treated adherence of the nickel to be deposited is improved.

Figure 6:
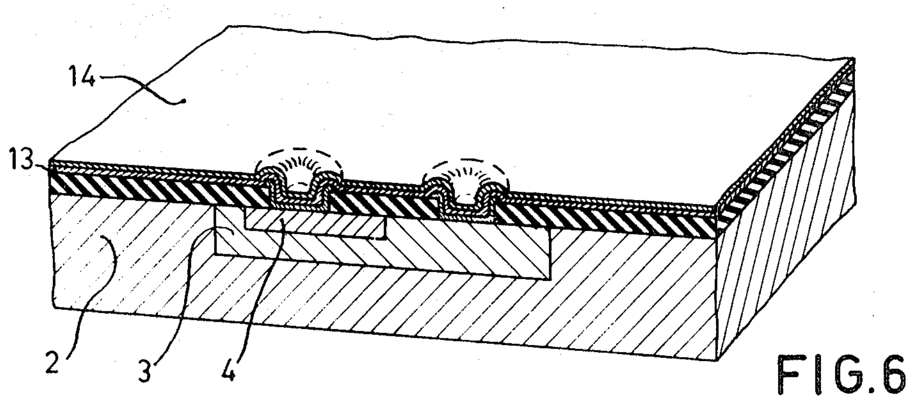

A layer of nickel 14, thickness approximately 5,000 A., is then deposited on said layer 13 (see FIG. 6). Preferably the nickel layer is not so thin that there is a substantial danger of diffusion of aluminum through the nickel layer when the layer is heated during further treatments. Preferably the nickel layer is not so thick that internal stresses give rise to difficulties during etching.

Suitable values of the thickness of the nickel layer lay between 0.3 and 0.7 $\mu$, preferably between 0.4 and 0.6 $\mu$.

The vapor deposition of nickel may be carried out in a vacuum of $1\times10^{-5}$ Torr, a nickel tape being arranged at some distance, for example 5 cm., from the surface to be coated and heated by the passage of current.

The nickel layer may also be deposited by electron bombardment of a nickel target from which particles are transported to the aluminum layer. Nickel deposition may also be effected by sputtering.

Figure 7:
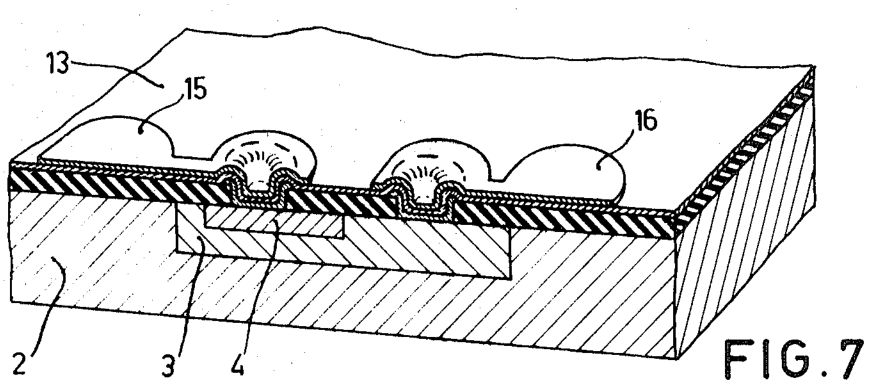

With a view to the further design of the conductive layers on the surface of the electronic device, a large part of the nickel intermediate layer is removed already in the next step of processing by coating those parts which are to remain with a masking layer—not shown—which is again obtained photographically in normal manner and etching away the uncovered part with a solution of three parts by volume of concentrated nitric acid in seven parts of water at approximately 50° C. The aluminum contact layer 13 is not noticeably attacked by said etching agent. So a so-called trace pattern remains on the contact layer 13 which pattern consists of two parts 15 and 16. The part 15 lies partly above the emitter region 4 and the collector region 2, the part 16 partly above the base region 3 and the collector region (see FIG. 7). It is again noted that the trace pattern in integrated semiconductor crystal circuits may have a much more complicated form. However, the shape may also be simpler, for example, in diodes and transistors of which, for example, the emitter and/or base regions have such large areas that connections can be provided immediately above a window.

In the subsequent processing step the assembly is again coated with a photosensitive masking layer 18, in which two apertures 19 and 20 are provided below which the parts 15 and 16 are visible. In the same manner, or simply mechanically, a part 21 located preferably near the edge of the masking layer 18 is removed so that the contact layer 13 is laid open.

Figure 8:
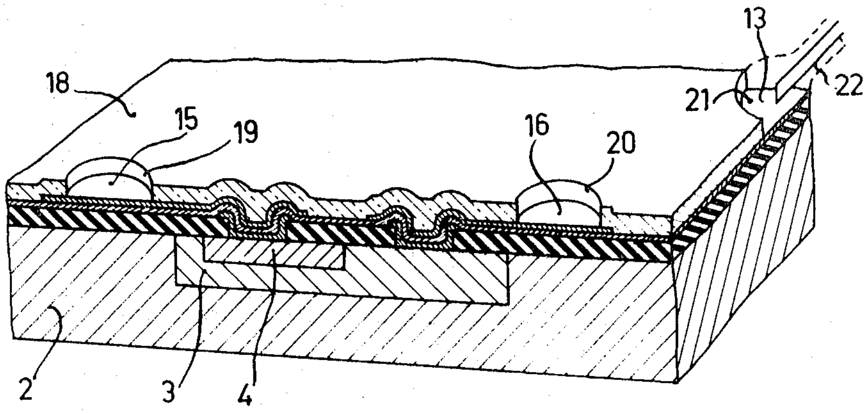
Figure 9:
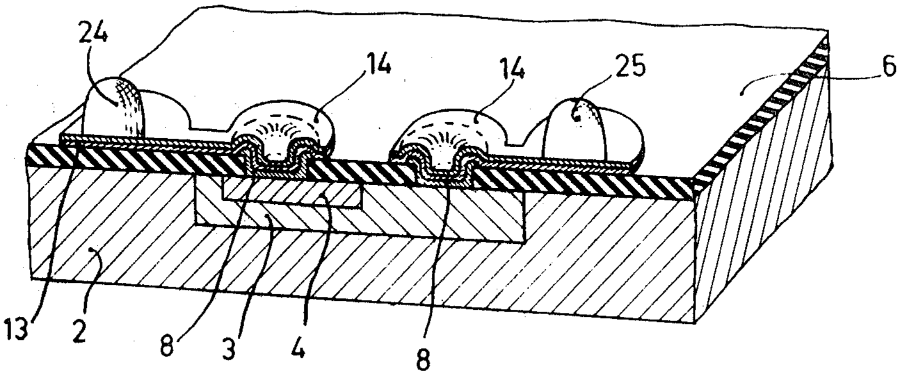

The assembly is placed in an insulating holder—not shown—while the tip of an insulated conductor 22 is forced on the contact layer 13. The insulation is diagrammatically shown in FIG. 8. This assembly is placed in an electroplating bath which contains per liter of water 200 g. of copper sulfate ($CuSO_4$), and 50 g. of sulfuric acid ($H_2SO_4$). Subsequently connections 20, 25 are deposited in the apertures 19 and 20 at approximately 25° C. for 1 hour, with a current density of approximately 6 ma./sq.cm. and at a voltage of approximately one-fifth volt.

The masking layer 18 and then the aluminum contact layer 13 are removed, the latter in as far as it is not coated by the trace pattern 15, 16. For this purpose an etching agent consisting of equal parts by volume of phosphoric acid ($H_3PO_4$) and water may be used, in which the device is dipped at 50° C. for 30 seconds.

In this manner copper connections 24 and 25, height approximately 10 microns, are formed on the two parts 15 and 16 of the trace pattern.

It was already noted that the application of nickel as an intermediate layer on aluminum has the additional advantage that said metals have different reactions to different etching agents for example, an etching liquid consisting of one volume of concentrated phosphoric acid ($H_3PO_4$), three volumes of concentrated nitric acid ($HNO_3$) and seven volumes of water dissolves both aluminum and nickel at 40° C. An etching liquid consisting of one volume of concentrated phosphoric acid ($H_3PO_4$) and one part of water, at 55° C, dissolves the aluminum but does not attack the nickel to any inconvenient extent. A solution of one-half percent of sodium hydroxide (NaOH) in water may alternatively be used at 25° C. for the same purpose. On the contrary, nickel may be etched away without attacking aluminum to any inconvenient extent in a liquid consisting of three volumes of concentrated nitric acid ($HNO_3$) and seven volumes of water at 50° C.

Thus, within the scope of this invention, several embodiments are possible in which both the geometry of the electronic device and the number and the sequence of the stages of manufacture may differ from the example.

What is claimed is:

1. A method of providing an electric connection on a surface of a semiconductor device, comprising the steps of:

a. providing on said surface a contact layer consisting of aluminum,
b. coating said aluminum layer by vapor deposition with a nickel layer,
c. selectively etching a conductive pattern in said nickel layer leaving exposed aluminum layer portions,
d. coating said aluminum layer and said nickel pattern with a selectively removable masking layer,
e. removing at least a part of said masking layer to expose at least a part of said nickel layer,
f. electrodepositing a conductive metal on said exposed nickel part,
g. removing said masking layer, and
h. selectively etching said exposed aluminum layer portions using said nickel pattern as an etch-resistant mask to remove the aluminum which is not coated with nickel.

2. A method as set forth in claim 26 wherein the nickel layer has a thickness between 0.3 and 0.7 microns, and the electrodeposited metal has a thickness much larger than that of the aluminum and nickel layers.

3. A method as set forth in claim 1 wherein copper is the electrodeposited metal.

4. A method as set forth in claim 1 wherein the semiconductor is silicon having a layer containing silicon oxide on its surface and a hole in the oxide over the surface region to be contacted, and after the aluminum is deposited but before the nickel is deposited the assembly is heated to alloy the aluminum to the silicon surface region contacted following which a second layer of aluminum is deposited.

* * * * *

PO-1050
(5/69)

UNITED STATES PATENT OFFICE
CERTIFICATE OF CORRECTION

Patent No. 3623961 Dated November 30, 1971

Inventor(s) KAREL JAKOBUS BLOK VAN LAER

It is certified that error appears in the above-identified patent and that said Letters Patent are hereby corrected as shown below:

Title Page, Col. 1, there should have been added a line indicating the applicant's assertion of the right of priority based upon the corresponding Netherlandish Application Serial No. 6701217 filed January 26, 1967.

Col. 3, line 22, "20,25" should read -- 24,25 --;

Claim 2, line 1, "26" should read -- 1 --.

Signed and sealed this 2nd day of May 1972.

(SEAL)
Attest:

EDWARD M.FLETCHER, JR.
Attesting Officer

ROBERT GOTTSCHALK
Commissioner of Patents